United States Patent
Ha et al.

(10) Patent No.: US 10,564,864 B1
(45) Date of Patent: Feb. 18, 2020

(54) METHOD FOR ESTIMATING DATA RETENTION TIME IN A SOLID STATE DRIVE

(71) Applicant: DELL PRODUCTS L.P., Round Rock, TX (US)

(72) Inventors: Justin L. Ha, Hayward, CA (US); Frederick K. H. Lee, Mountain View, CA (US); Seungjune Jeon, Santa Clara, CA (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 16/151,750

(22) Filed: Oct. 4, 2018

(51) Int. Cl.
*G11C 16/34* (2006.01)
*G06F 3/06* (2006.01)

(52) U.S. Cl.
CPC .......... *G06F 3/0617* (2013.01); *G06F 3/0604* (2013.01); *G06F 3/0659* (2013.01); *G06F 3/0679* (2013.01); *G11C 16/34* (2013.01)

(58) Field of Classification Search
CPC .... G06F 3/0617; G06F 3/0659; G06F 3/0679; G06F 3/0604; G11C 13/0035; G11C 16/34; G11C 16/349; G11C 29/50016
See application file for complete search history.

(56) References Cited

U.S. PATENT DOCUMENTS

| | | | |
|---|---|---|---|
| 6,366,514 B1 * | 4/2002 | Chien | G11C 11/406 365/201 |
| 8,719,501 B2 | 5/2014 | Flynn et al. | |
| 8,719,531 B2 | 5/2014 | Strange et al. | |
| 8,806,106 B2 | 8/2014 | Goss et al. | |
| 8,966,343 B2 | 2/2015 | Syu et al. | |
| 9,250,820 B2 | 2/2016 | Salessi et al. | |
| 9,263,158 B2 | 2/2016 | Prohofsky et al. | |
| 9,595,347 B2 | 3/2017 | Zhao et al. | |
| 9,977,736 B2 | 5/2018 | Melik-Martirosian | |
| 2010/0262795 A1 * | 10/2010 | Hetzler | G06F 11/1068 711/162 |
| 2013/0080694 A1 * | 3/2013 | Iyer | G11C 11/40603 711/106 |
| 2014/0059405 A1 * | 2/2014 | Syu | G11C 16/349 714/773 |
| 2014/0146607 A1 * | 5/2014 | Nagai | G06F 7/58 365/185.04 |

* cited by examiner

*Primary Examiner* — Khamdan N. Alrobaie
(74) *Attorney, Agent, or Firm* — Jackson Walker LLP; Christopher J. Rourk

(57) ABSTRACT

A system for controlling a solid state drive is disclosed that includes a plurality of NAND memory devices, each NAND memory device further comprising at least one die, a plurality of blocks associated with each of the dies, and a plurality of pages associated with each of the blocks. A pseudo clock system configured to determine a pseudo clock value for each of the NAND memory devices. An effective retention time system coupled to the plurality of NAND memory devices and configured to determine a maximum effective retention time for each of the NAND memory devices as a function of the pseudo clock value for the NAND memory device.

20 Claims, 1 Drawing Sheet

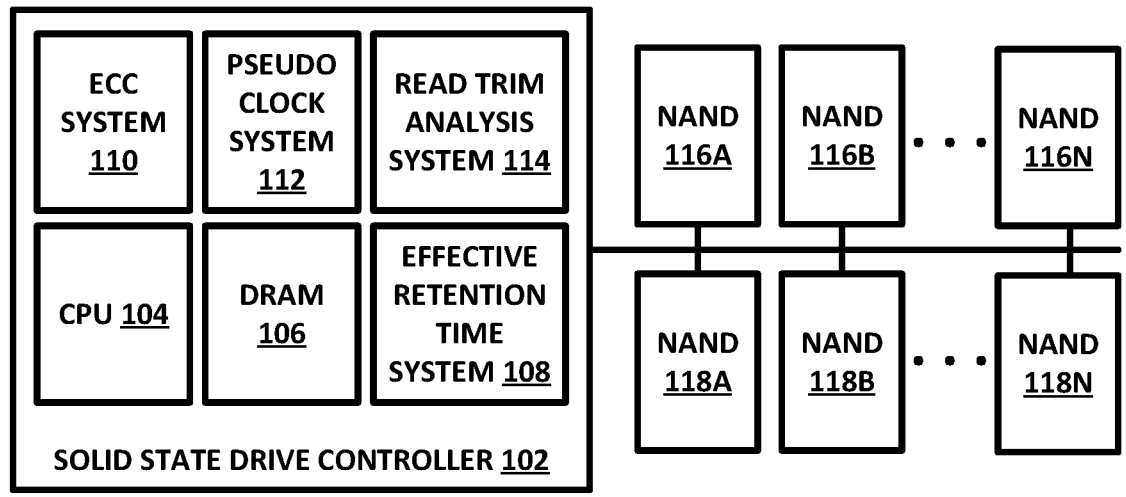
FIGURE 1    100
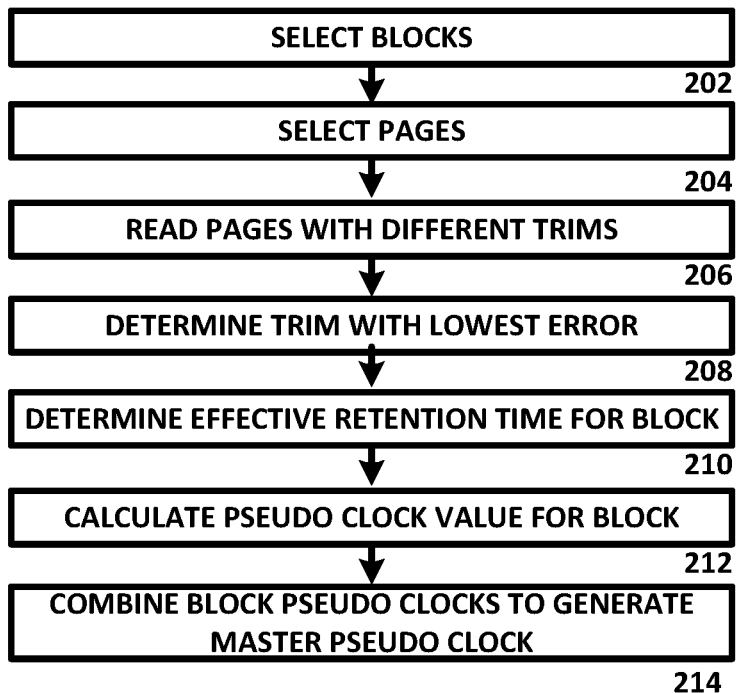
FIGURE 2    200

METHOD FOR ESTIMATING DATA RETENTION TIME IN A SOLID STATE DRIVE

TECHNICAL FIELD

The present disclosure relates generally to NAND memory devices, and more specifically to a method for estimating data retention time in a solid state drive.

BACKGROUND OF THE INVENTION

Solid state drives must periodically refresh data, but use inefficient processes for doing so that have substantial processing overhead.

SUMMARY OF THE INVENTION

A system for controlling a solid state drive is disclosed that includes a plurality of NAND memory devices, where each NAND memory device further includes at least one die, a plurality of blocks associated with each of the dies, and a plurality of pages associated with each of the blocks. A pseudo clock system is configured to determine a pseudo clock value for each of the NAND memory devices. An effective retention time system is coupled to the plurality of NAND memory devices and is configured to determine a maximum effective retention time for each of the NAND memory devices as a function of the pseudo clock value for the NAND memory device.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which:

FIG. 1 is a diagram of a solid state drive controller with pseudo clock control, in accordance with an example embodiment of the present disclosure; and FIG. 2 is a diagram of a pseudo clock determination algorithm, in accordance with an example embodiment of the present disclosure.

DETAILED DESCRIPTION OF THE INVENTION

In the description that follows, like parts are marked throughout the specification and drawings with the same reference numerals. The drawing figures may be to scale and certain components can be shown in generalized or schematic form and identified by commercial designations in the interest of clarity and conciseness.

Solid state drives (SSDs) typically do not have an internal real-time clock to track power-off time, which is the elapsed time between when an SSD is powered down and powered up again. Without knowing the total power-off time, an SSD that has gone through power cycles is unable to figure out how long each block of data has been stored in the drive, also known as the data retention time. Data retention time is important for a number of operations in an SSD. For example, if the retention time for a block of data is close to the maximum retention time the SSD is designed for, the block needs to be refreshed by garbage collecting data from the block into a new block to avoid potential error correcting code (ECC) failures in read operations.

In another example embodiment, the optimal set of read voltages (also known as read trims) to apply when reading a page of data from a block depends on various factors, such as the program/erase cycle (PEC) count of the block, the retention time of the block, the temperature(s) at which the SSD has been operating, the page number within the block and so forth. Knowing the data retention time can help to determine the best read trims to apply when reading data from the drive.

To minimize latency in read operations, the optimal read trims can be pre-determined via offline NAND characterization experiments. The optimal read trims are then stored in the SSD as system data and loaded into DRAM during power up of the drive. Since the amount of DRAM in an SSD is limited, it is not possible to store an optimal set of read trims for all combinations of the variables involved at a fine granularity. For example, the drive may only have sufficient DRAM for storing the optimal read trims for a particular operating temperature. Thus, if the drive ends up operating at a different temperature from the temperature at which the optimal read trims are obtained, or if the drive is operating within a temperature range, the read trims may no longer be optimal and may result in a higher number of ECC failures in read operations.

The present disclosure describes a method to implement a pseudo clock in an SSD, which can be used for estimating an "effective" retention time for each block of data across power cycles. Instead of measuring the true retention time as if a real-time clock were available, the pseudo clock measures an effective retention time that takes into account any temperature deviations from the temperature at which the pre-determined optimal read trims are obtained. This effective retention time is more meaningful and useful than the true retention time, since it correlates to the actual conditions of the NAND cells due to temperature variations and allows the SSD to apply adjusted read trims to minimize the number of ECC failures in read operations. For example, if the SSD is operating at a higher temperature than the temperature at which the optimal read trims are obtained, the effective retention time can be longer than the true retention time, such as when the NAND cells exhibit properties as if data were stored for a longer period of time at the temperature at which the optimal read trims are obtained. The SSD can apply read trims that correspond to the longer effective retention time in read operations. Conversely, if the SSD is operating at a lower temperature than the temperature at which the optimal read trims are obtained, the effective retention time can be shorter than the true retention time, such as where the NAND cells exhibit properties as if data were stored for a shorter period of time at the temperature at which the optimal read trims are obtained. The SSD can apply read trims that correspond to the shorter effective retention time in read operations.

In one example embodiment, a 4-dimensional optimal read trim table can be stored in an SSD for read operations. The 4 dimensions can include PEC count, data retention time, drive operating temperature and page number within a block. In order to optimize limited DRAM capacity, the 4 dimensions in the table can be coarsely sampled, if necessary. For example, a set of optimal read trims can be stored for each combination of PEC count, data retention time and page number in predetermined increments, such as 500 for PEC count, 1 week for data retention time and 4 for page number. Only one target operating temperature can be chosen. If the maximum PEC count and the maximum retention time the SSD can support is 10,000 and 8 weeks, respectively, and if there are 768 pages per block, the table will contain (10,000/500) (8/1)*(768/4)=30720 different sets of optimal read trims.

For example, if a read operation targets page 13 of a block whose PEC count is 750 and data retention time is 3.5 weeks, the set of optimal read trims that corresponds to (PEC=500 to 999, 3 weeks<=retention time<4 weeks, page number=12 to 15) will be used. The effective data retention time estimation method described in this invention disclosure is based on the availability of such an optimal read trim table.

The pseudo clock associated with the disclosed estimation method can be implemented by a register, such as 16 bits in length. Before the SSD is written, the value of the pseudo clock can be set to 0. Thereafter, the pseudo clock can be updated periodically, with its value remaining the same between any two updates. The unit of the pseudo clock is chosen to match the granularity of the data retention time in the optimal read trim table, which is 1 week in the above example. To maintain the precision of the pseudo clock, the updating interval should not be longer than 1 week, except when the SSD is shut down or power cycling occurs. Whenever the last page of a block is written, the value of the pseudo clock can be recorded in the block metadata in DRAM as a timestamp, together with other block metadata, such as the PEC count. These metadata are flushed to NAND when a sudden power loss occurs. Additionally, the value of the pseudo clock can be included as part of the metadata of the last page which is written to the spare bytes of the page. For read operations, the data retention time of a block is calculated by subtracting the timestamp of the block from the current value of the pseudo clock, which can then be used to find the correct entry in the optimal read trim table.

The pseudo clock can be updated indirectly by estimating the effective data retention time for a number of blocks in the SSD. These blocks can be selected randomly or by some specific criteria. For instance, a single block can be selected randomly from each plane of every die. For each block, read operations are conducted on a number of pages. Similarly, the pages to read can be selected randomly or by some specific criteria. Given the PEC count of a block and the page number to read, 2 out of 4 variables in the read trim table are already known. Instead of trying to figure out the true data retention time as measured by a real-time clock, the temperature-adjusted effective data retention time of a page can be estimated by reading the page multiple times, each time using a set of read trims that corresponds to a different data retention time in the table while fixing the other 2 variables to the known values. For each page read, the total number of bit errors corrected by the ECC on all the codewords in the page are recorded, and the data retention time corresponding to the set of read trims that produces the fewest total number of bit errors is taken as the effective data retention time of the page. The effective data retention time of a block can then be obtained by statistically combining the per-page results, such as using simple averaging, averaging with weights, majority rule, or more elaborated methods depending on the characteristics of the NAND used. Finally, to update the pseudo clock, a per-block value is first calculated by adding the effective data retention time of the block to the timestamp of the block. The per-block values are then statistically combined to obtain the new value for the pseudo clock.

As an illustration for the estimation procedure, assume that 4 blocks, namely block 1, block 2, block 3 and block 4, are selected. The timestamps for these blocks are: block 1=12 weeks, block 2=13 weeks, block 3=15 weeks, block 4=18 weeks. Furthermore, assume that 2 pages are selected from each block for read operations. Since the optimal read trim table in the example above has 8 data retention values (because the read trim table contains 2 months/8 weeks of weekly data readings), each page is read 8 times, each time using a set of read trims that corresponds to one of the 8 data retention values. Assume that, after comparing the total number of bit errors from each page read, the per-page effective data retention time are as follows: (block 1, page 1)=7 weeks, (block 1, page 2)=8 weeks; (block 2, page 1)=6 weeks, (block 2, page 2)=6 weeks; (block 3, page 1)=5 weeks, (block 3, page 2)=4 weeks; and (block 4, page 1)=1 week, (block 4, page 2)=2 weeks. If simple averaging is used to combine these results, the per-block effective data retention time will be: block 1=7.5 weeks, block 2=6 weeks, block 3=4.5 weeks and block 4=1.5 weeks. Hence, the per-block pseudo clock values are (each block's timestamp plus their respective effective data retention time): block 1=19.5 weeks, block 2=19 weeks, block 3=19.5 weeks and block 4=19.5 weeks. If simple averaging is used to combine these values, the overall new value for the pseudo clock, after rounding to the nearest integer, will be 19 weeks. Given this new pseudo-clock value, any read operations to block 1, block 2, block 3 and block 4 can use a set of optimal read trims that corresponds to the data retention time of 7 weeks, 6 weeks, 4 weeks and 1 week, respectively, until the next update for the pseudo clock is computed. Moreover, all newly written blocks can have a timestamp of 19 weeks.

Continuing with the above illustration, assume that 1 week has passed and the pseudo clock is to be updated again. If the drive operating temperature is the same as the temperature at which the optimal read trims are obtained, the overall new value of the pseudo clock, after carrying out the estimation procedure, should ideally be equal to 20 weeks. On the other hand, if the drive is operating at a higher temperature than the temperature at which the optimal read trims are obtained, the extra data retention time added to each page is likely to be more than 1 week, such as 9 weeks for (block 1, page 1) instead of 8 weeks and 10 weeks for (block 1, page 2) instead of 9 weeks. As such, the overall new value of the pseudo clock may come out to be more than 20 weeks. Similarly, if the drive is operating at a lower temperature than the temperature at which the optimal read trims are obtained, the extra data retention time added to each page is likely to be less than 1 week. Thus, it is possible that, after rounding, the overall new value of the pseudo clock can remain at 19 weeks. In other words, based on the actual drive operating temperature, the pseudo clock can move forward or backward in time relative to a real-time clock, should the latter be available. This behavior is a desired property of a temperature-adjusted data retention time estimation method.

Due to operations such as statistical averaging and rounding in the estimation procedure, it is possible that the effective data retention time computed by subtracting the timestamp from the current pseudo clock value is a negative value. When this happens, the result can be lower bounded to 0. Similarly, if the computed effective data retention time exceeds the maximum data retention time stored in the read trim table, the result can be upper bounded to the maximum data retention time. This scenario can be encountered if the SSD has been shut down for a long time. If the estimation procedure chooses too many blocks that give a per-block effective data retention time that equals the maximum data retention time, the overall pseudo clock value estimated may not be accurate. In this case, some of such blocks can be discarded and replaced with other blocks in the estimation procedure.

In practice, the granularity of 1 week for the data retention time in the optimal read trim table is a typical choice, as a finer granularity might not substantially improve the accuracy of the optimal read trims, but could consume more DRAM for storage. Since optimal read trims are insensitive to a short retention time, the read operations required for the estimation procedure can be spread out over a few hours or even a day before the weekly updating deadline without affecting the accuracy of the final estimate of the pseudo clock. Therefore, the performance impact due to the extra read operations can be negligible. Note that an SSD does have an internal clock to keep track of power-on time, which can be used for scheduling the updates. However, this clock is not available when the SSD is powered down, and thus cannot be used to track power-off time. Consequently, once the SSD is booted up again after a power cycling event, the estimation procedure can be run to obtain a new pseudo clock value so that the effective data retention time of each block can be calculated. A block with an effective data retention time that exceeds the maximum data retention time can be scheduled for garbage collection to preserve data integrity.

Traditionally, SSDs are designed with the assumption that data retention time is unknown. As such, SSDs do not use an optimal read trim table for read operations, because that table has data retention time as one of its dimensions. Given that data retention time is a key factor in determining optimal read trims, the ability to incorporate data retention time into such a table can significantly improve the accuracy of the resultant optimal read trims and can reduce the frequency of invoking the read retry procedure. The read retry procedure can be invoked whenever a page read fails, where the problematic page is then read with different sets of read trims until one set of read trims allows the page to be read successfully. Reduced use of the read retry procedure thus directly improves various quality-of-service (QoS) metrics on read latency. Consequently, the use of the disclosed data retention time estimation system and method allows an accurate optimal read trim table to be created and applied that incorporates data retention time as one of its dimensions to be used, which in turn enables better QoS guarantees that are critical for enterprise SSDs.

After an SSD is powered up, it needs to make sure that the data retention time of each block does not exceed the maximum data retention time the SSD is designed for. If the maximum data retention time is exceeded, a block should be scheduled for garbage collection to ensure that the risk of read failures on the block does not further increase. Without knowledge of data retention time, a simple method SSDs can utilize to verify the data integrity of each block after being powered up is to read a few selected pages from each block and compare the total number of bit errors corrected by ECC on each page to a pre-determined threshold. If the total exceeds the threshold for one or more of the pages, it is likely that read failures will occur soon on most pages in the block, so the block should be scheduled for garbage collection. Although this process is simple to implement, it incurs a relatively large performance overhead, as each block needs to be read a few times. In contrast, the proposed data retention time estimation method only requires reading a small subset of blocks in the SSD to update the pseudo-clock value, which can then be used to calculate the data retention time of each block. The disclosed system and method provide a more efficient way to ensure data integrity of each block whenever an SSD is booted up again after a power cycling event.

The disclosed system and method also provides significantly more than prior art approaches to addressing this issue, because it takes into account the impact of any deviations of drive operating temperature from the temperature at which the optimal read trim table is obtained, and allows the best read trims that reflect the true characteristics of the NAND cells to be applied for each read operation. Because SSDs are generally designed with the assumption that data retention time is unknown, techniques for estimating data retention time, including techniques for estimating temperature-adjusted data retention time, currently do not exist. Consequently, the disclosed system and method for estimating data retention time provide high-performance, high-reliability enterprise-grade SSDs with stringent QoS requirements.

FIG. 1 is a system 100 with pseudo clock control, in accordance with an example embodiment of the present disclosure. System 100 includes solid state drive controller 102, central processing unit (CPU) 104, dynamic random access memory (DRAM) 106, effective retention time system 108, error correction code (ECC) system 110, pseudo clock system 112, read trim analysis system 114, NAND devices 116A through 116N and NAND devices 118A through 118N, each of which can be implemented in hardware or a suitable combination of hardware and software.

Solid state drive controller 102 can be provided in conjunction with a self-contained SSD or in other suitable manners, and is configured to control the operation of an SSD. In one example embodiment, solid state drive controller 102 can be implemented as one or more integrated circuits that are coupled to a system data bus and a NAND memory array, such as NAND devices 116A through 116N and NAND devices 118A through 118N. Solid state drive controller 102 includes additional system components that are not explicitly shown, such as a host interface, a NAND memory interface, input/output interfaces, a power source interface and so forth.

Central processing unit (CPU) 104 provides programmable processing of data for solid state drive controller 102. In one example embodiment, CPU 104 can operate based on one or more algorithms that are provided to control the sequence of operations of solid state drive controller 102, such as discussed herein.

Dynamic random access memory (DRAM) 106 provides data storage for use by CPU 104 and other components of solid state drive controller 102, as discussed herein. In one example embodiment, DRAM 106 can be used to store a 4-dimensional optimal read trim table for read operations, where the 4 dimensions can include PEC count, data retention time, drive operating temperature and page number within a block, or other suitable data. Likewise, additional dimensions can be added or one of these dimensions can be deleted, where suitable. Other suitable data can also or alternatively be stored in DRAM 106.

Effective retention time system 108 is configured to implement one or more algorithms for using pseudo clock system 112 to measure an effective retention time that takes into account temperature deviations from the temperature at which pre-determined optimal read trims were obtained. This effective retention time correlates to the actual conditions of NAND devices 116A through 116N and 118A through 118N, due to temperature variations, and allows solid state drive controller 102 to apply adjusted read trims to minimize the number of ECC failures in read operations, as discussed in greater detail herein.

ECC system 110 is configured to implement one or more algorithms that are configured to perform ECC processing on NAND devices 116A through 116N and 118A through 118N, such as on a predetermined or selected page of data in a specific block, plane and die. The ECC processing can be performed in conjunction with read trim analysis system 114 to determine an optimal read trim level, as well as to determine when the number of ECC errors has increased to the point where the data stored in that NAND page or other related pages should be rewritten. In one example embodiment, the algorithms can track pages to be used in conjunction with pseudo clock processing, errors detected during successive application of different read trim settings, requests received from pseudo clock system 112 and other suitable data and algorithms as discussed herein.

Pseudo clock system 112 is configured to implement one or more algorithms to measure an effective retention time that takes into account temperature deviations from the temperature at which an optimal read trims were obtained. The effective retention time determined by these algorithms correlates to the actual conditions of the NAND cells due to temperature variations and allow solid state drive controller 102 to apply adjusted read trims for maintenance of NAND devices 116A through 116N and 118A through 118N, to minimize the number of ECC failures in read operations.

Read trim analysis system 114 is configured to implement one or more algorithms to obtain read trim settings from a table, to apply the read trim settings to pages of a NAND device, to store updated read trim settings for each page and to respond to requests from pseudo clock system 112, effective retention time system 108 and other systems of solid state drive controller 102. Read trim analysis system 114 reduces the number of ECC errors due to an improper read trim setting, and thus determines the correct read trim setting.

In operation, system 100 provides a pseudo clock that can be used to reduce the amount of ECC processing that is needed for an SSD drive, which reduces the use of read retry procedures and improves quality-of-service QoS metrics relating to read latency, which can be adversely impacted by the read retry procedures, as discussed further herein.

FIG. 2 is a diagram of an algorithm 200 for pseudo clock determination, in accordance with an example embodiment of the present disclosure. Algorithm 200 can be implemented on one or more processors.

Algorithm 200 begins at 202, where a number of blocks of a NAND memory device are selected for effective data retention time estimation. In one example embodiment, the number of blocks can be based on empirical analysis of the effectiveness of a pseudo clock in determining the retention time for data stored in the NAND memory device or other suitable data. The blocks can be randomly selected, selected based on historical data identifying the most accurate blocks to be used for pseudo clock analysis or in other suitable manners. The algorithm then proceeds to 204.

At 204, a number of pages for the estimation procedure are determined for each selected block. In one example embodiment, the number of pages can be based on empirical analysis of the effectiveness of a pseudo clock in determining the retention time for data stored in the NAND memory device or other suitable data. The pages can be randomly selected, selected based on historical data identifying the most accurate pages to be used for pseudo clock analysis or in other suitable manners. The algorithm then proceeds to 206.

At 206, each selected page is read multiple times by using different sets of read trims that correspond to different retention times in a read trim table. In one example embodiment, the read trim table can be accessed from a DRAM memory device or other suitable devices. The algorithm then proceeds to 208.

At 208, a set of read trims that produces the fewest total number of bits errors across all code words is found for each selected page. In addition, an identification of the read trim and the corresponding retention time can be stored. The algorithm then proceeds to 210.

At 210, the recorded retention times of all selected pages of a selected block are statistically combined to obtain an effective retention time for the block. In one example embodiment, the pages can be combined as discussed herein or in other suitable manners. The algorithm then proceeds to 212.

At 212, the computed effective retention time for each block is added to the timestamp of the block to obtain a pseudo clock value for the block. In one example embodiment, the computed effective retention time for each block can be added to the timestamp of the block to obtain the pseudo clock value for the block as discussed herein or in other suitable manners. The algorithm then proceeds to 214.

At 214, the computed pseudo clock values of all selected blocks are statistically combined to obtain the new pseudo clock value overall. In one example embodiment, the computed pseudo clock values of all selected blocks can be statistically combined to obtain the new pseudo clock value overall as discussed herein or in other suitable manners. The algorithm then terminates.

In operation, algorithm 200 provides a pseudo clock that can be used to reduce the amount of ECC processing that is needed for an SSD drive, which reduces the use of read retry procedures and improves QoS metrics relating to read latency. Although algorithm 200 is shown as a flow chart, it can be implemented using object-oriented programming, a state diagram or other suitable programming paradigms.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for controlling a solid state drive, comprising:
    a plurality of NAND memory devices, each NAND memory device further comprising at least one die, a plurality of blocks associated with each of the dies, and a plurality of pages associated with each of the blocks;
    a pseudo clock system configured to determine a pseudo clock value for each of the NAND memory devices; and
    an effective retention time system coupled to the plurality of NAND memory devices and configured to determine a maximum effective retention time for each of the NAND memory devices as a function of the pseudo clock value for the NAND memory device.

2. The system of claim 1 further comprising a read trim analysis system configured to determine an optimal read trim for a NAND memory device.

3. The system of claim 2 further comprising an error correction code system configured to determine an error correction code value for one or more of the pages of each of the NAND memory devices, and wherein the read trim analysis system is configured to receive the error correction code value and to determine the optimal read trim using the error correction code value.

4. The system of claim 1 wherein the effective retention time system is configured to determine a retention time for each page of a plurality of pages of a selected block.

5. The system of claim 1 wherein the effective retention time system is configured to determine a retention time for each page of a plurality of pages of a selected block and to statistically combine the retention time for each page of the selected block to obtain an effective retention time for the selected block.

6. The system of claim 1 wherein the pseudo clock system is further configured to determine a pseudo clock value for each block of a plurality of blocks of a selected NAND memory device.

7. The system of claim 1 wherein the pseudo clock system is further configured to determine a pseudo clock value for each block of a plurality of blocks of a selected NAND memory device and to statistically combine the pseudo clock values to obtain a NAND memory device pseudo clock value.

8. A method for controlling a solid state drive, comprising:
    selecting a number of blocks of a NAND memory device for data retention time estimation;
    using a predetermined set of read trims to generate a plurality of retention times for each of the blocks; and
    generating a pseudo clock value based on the read trims that result in a lowest retention time for each of the blocks.

9. The method of claim 8 wherein using the predetermined set of read trims to generate the plurality of retention times for each of the blocks comprises using the predetermined set of read trims to generate a plurality of retention times for each of a plurality of pages for one or more of the blocks.

10. The method of claim 8 further comprising statistically combining the plurality of retention times for each of the blocks.

11. A system for controlling a solid state drive, comprising:
a plurality of NAND memory devices, each NAND memory device further comprising at least one die, a plurality of blocks associated with each of the dies, and a plurality of pages associated with each of the blocks:
a pseudo clock system configured to determine a pseudo clock value for each of the NAND memory devices;
an effective retention time system coupled to the plurality of NAND memory devices and configured to determine a maximum effective retention time for each of the NAND memory devices as a function of the pseudo clock value for the NAND memory device;
a read trim analysis system configured to determine an optimal read trim for a NAND memory device; and
wherein the effective retention time system is configured to determine a retention time for each page of a plurality of pages of a selected block.

12. The system of claim 11 further comprising an error correction code system configured to determine an error correction code value for one or more of the pages of each of the NAND memory devices, and wherein the read trim analysis system is configured to receive the error correction code value and to determine the optimal read trim using the error correction code value.

13. The system of claim 11 wherein the effective retention time system is configured to determine a retention time for each page of a plurality of pages of a selected block and to statistically combine the retention time for each page of the selected block to obtain an effective retention time for the selected block.

14. The system of claim 11 wherein the pseudo clock system is further configured to determine a pseudo clock value for each block of a plurality of blocks of a selected NAND memory device.

15. The system of claim 11 wherein the pseudo clock system is further configured to determine a pseudo clock value for each block of a plurality of blocks of a selected NAND memory device and to statistically combine the pseudo clock values to obtain a NAND memory device pseudo clock value.

16. The system of claim 1 further comprising a read trim analysis system igured to determine an optimal read trim for a NAND memory device, wherein the effective retention time system is configured to determine a retention time for each page of a plurality of pages of a selected block and to statistically combine the retention time for each page of the selected block to obtain an effective retention time for the selected block.

17. The system of claim 1 further comprising a read trim analysis system configured to determine an optimal read trim for a NAND memory device, wherein the pseudo clock system is further configured to determine a pseudo clock value for each block of a plurality of blocks of a selected NAND memory device.

18. The system of claim 1 further comprising a read trim analysis system configured to determine an optimal read trim for a NAND memory device, wherein the pseudo clock system is further configured to determine a pseudo clock value for each block of a plurality of blocks of a selected NAND memory device and to statistically combine the pseudo clock values to obtain a NAND memory device pseudo clock value.

19. The system of claim 1 further comprising:
a read trim analysis system configured to determine an optimal read trim for a NAND memory device;
an error correction code system configured to determine an error correction code value for one or more of the pages of each of the NAND memory devices, and wherein the read trim analysis system is configured to receive the error correction code value and to determine the optimal read trim using the error correction code value and the effective retention time system is configured to determine a retention time for each page of a plurality of pages of a selected block.

20. The system of claim 1 further comprising:
a read trim analysis system configured to determine an optimal read trim for a NAND memory device;
an error correction code system configured to determine an error correction code value for one or more of the pages of each of the NAND memory devices, and wherein the read trim analysis system is configured to receive the error correction code value and to determine the optimal read trim using the error correction code value and the effective retention time system is configured to determine a retention time for each page of a plurality of pages of a selected block and to statistically combine the retention time for each page of the selected block to obtain an effective retention time for the selected block.

* * * * *